(12) United States Patent  
Kelber et al.

(10) Patent No.: US 9,620,654 B2  
(45) Date of Patent: Apr. 11, 2017

(54) COHERENT SPIN FIELD EFFECT TRANSISTOR

(71) Applicant: QUANTUM DEVICES, LLC, Potomac, MD (US)

(72) Inventors: Jeffry Kelber, Denton, TX (US); Peter Dowben, Lincoln, NE (US)

(73) Assignee: QUANTUM DEVICES, LLC, Rockville, MD (US)

( * ) Notice: Subject to any disclaimer, the term of this patent is extended or adjusted under 35 U.S.C. 154(b) by 0 days.

(21) Appl. No.: 14/677,997

(22) Filed: Apr. 3, 2015

(65) Prior Publication Data

US 2016/0093746 A1    Mar. 31, 2016

Related U.S. Application Data

(63) Continuation-in-part of application No. 13/343,970, filed on Jan. 5, 2012, now Pat. No. 8,748,957.

(51) Int. Cl.

| | |
|---|---|
| *H01L 21/02* | (2006.01) |
| *H01L 29/82* | (2006.01) |
| *H01L 29/16* | (2006.01) |
| *H01L 29/66* | (2006.01) |
| *H01L 29/51* | (2006.01) |
| *H01L 29/423* | (2006.01) |
| *H01L 21/04* | (2006.01) |
| *H01L 29/49* | (2006.01) |
| *H01L 29/786* | (2006.01) |

(52) U.S. Cl.  
CPC .......... *H01L 29/82* (2013.01); *H01L 21/0262* (2013.01); *H01L 21/02175* (2013.01); *H01L 21/02266* (2013.01); *H01L 21/02527* (2013.01); *H01L 21/02631* (2013.01); *H01L 21/044* (2013.01); *H01L 29/1606* (2013.01); *H01L 29/42356* (2013.01); *H01L 29/495* (2013.01); *H01L 29/4908* (2013.01); *H01L 29/517* (2013.01); *H01L 29/66477* (2013.01); *H01L 29/66742* (2013.01); *H01L 29/66984* (2013.01); *H01L 29/78603* (2013.01); *H01L 29/78684* (2013.01)

(58) Field of Classification Search  
CPC ........... H01L 29/66984; H01L 29/1606; H01L 29/4908  
See application file for complete search history.

(56) References Cited

U.S. PATENT DOCUMENTS 8,748,957 B2 *  6/2014  Kelber .............. H01L 29/66984  
257/29

* cited by examiner

*Primary Examiner* — Elias M Ullah  
(74) *Attorney, Agent, or Firm* — The Kelber Law Group

(57) ABSTRACT

A voltage switchable coherent spin field effect transistor is provided by depositing a ferromagnetic base like cobalt on a substrate. A chrome oxide layer is formed on the cobalt by MBE at room at UHV at room temperature. There was thin cobalt oxide interface between the chrome oxide and the cobalt. Other magnetic materials may be employed. A few ML field of graphene is deposited on the chrome oxide by molecular beam epitaxy, and a source and drain are deposited of base material. The resulting device is scalable, provides high on/off rates, is stable and operable at room temperature and easily fabricated with existing technology.

3 Claims, 5 Drawing Sheets

(PRIOR ART)

COHERENT SPIN FIELD EFFECT TRANSISTOR

PRIORITY DATA AND INCORPORATION BY REFERENCE

This application claims benefit of priority to U.S. patent application Ser. No. 13/343,970 filed Jan. 5, 2012 which is incorporated by reference in its entirety.

The subject matter of this patent application was developed without federal or state funding. Although both inventors named herein are the beneficiaries of support from various corporate organizations, and are employed by Universities at which they work on subject matter including the development and characterization of materials formed by the direct growth of graphene on various substrates, no University time, compensation or apparatus was employed, involved or relied on in the development of the subject matter disclosed and claimed herein.

BACKGROUND OF THE INVENTION

Field of the Invention

The present invention relates to the development of a non-local spin valve, sometimes referred to as a spin field effect transistor, or spin-FET. Spin-FETS that can be operated at ambient temperatures offer the advantages of greater data storage in less space, with a reduced power consumption, and high sensitivity. Spin-FETS offer non-volatile solid state data storage the does not require the constant application of current to sustain it. Spin-FETS are, accordingly, an attractive technology to be used in the development of Magnetic Random Access Memory, or MRAMs. Spin-FETS also find application in logic devices, or combined logic and spin devices. Richter et al, *Appl. Phys. Lett.,* 80 1291 (2002). Among the least consequential, but easily understood, effects of such advances is the ability to provide computing devices which need not consult a stored database before uploading, as most personal computers are arranged today. They offer an "instant on" capability: that is to say, non-volatile memory and logic.

Background of the Technology

The spin-FET may have been first described as a desirable device to construct in 1990 (Datta et al, *Appl. Phys. Lett.,* 56, 665 (1990)). These devices contemplate a non-magnetic layer which is used for transmitting and controlling the spin polarization of electrons from source to drain. A variety of field materials have been proposed over the years. Most of the concentrated effort in this field has looked at spin injection as a means of arriving at the capabilities offered by the theoretical spin-FET as described. Notwithstanding this effort, no room temperature spin-FET, that is scaleable, and reliable at low power consumption has yet been provided.

In one approach, the ability to deposit thin layers of cobalt on semi-conducting substrates such as GaAs was developed, in an effort to provide for a controlled magnetization perpendicular to the substrate. Bournel et al, *Physics E,* 10, 86-90 (2001). Ultimately, these researchers were unable to secure a stable, perpendicular magnetization for a ferromagnetic/semiconductor contact field, but research did demonstrate the ability to grow thin layers of oxidized Co on semiconductors such as gallium arsenide and silicon. As investigations into the provision of spin-FETs continue, the ability to adapt the resulting technology to existing materials will become increasingly important.

SUMMARY OF THE INVENTION

Our invention resides in a new type of non-local spin valve or spin field effect transistor (spin-FET), based upon graphene deposited directly onto a magnetically polarizeable electrically insulating or semiconducting substrate such as an oxide, and with the oxide dielectric, with net interface spin polarization, formed on top of a base ferromagnetic layer. In essence, the polarization of the substrate will result in polarization of the transition metal ions of the oxide dielectric at both the top and bottom interfaces, which will in turn lead to polarization of the graphene valence/conduction band electrons. Using appropriate magnetically polarizable source and drain electrodes, a low power, high on-off rate spin-FET can be constructed gated by the bottom base ferromagnetic layer, separated from what amounts to a narrow conduction channel by a dielectric oxide. An example of this is shown in FIG. 1.

In developing this new or non-local spin-FET, although the applicants do not wish to be bound by this explanation, ferromagnetic polarization of the base layer, or gate, is effective to polarize the metal ions in the magnetic oxide at both the top and bottom interfaces. At the top interface, the one in intimate contact with the graphene conduction channel, these ions will undergo exchange interactions with the graphene valence/conduction band electrons. Such "proximity polarization" has been predicted for graphene [1]. Strong ion/conduction electron exchange interactions have been observed in impurity-doped oxide quantum dots, resulting in magnetic behavior in closed shell systems [2-4].

In elementary terms, in FET operation, when the polarization of the source and drain are in the same direction as that of the graphene, there will be a low non-local resistance (high current) between the source and drain. Switching the polarization of the base layer (or gate) will change the polarization of the graphene, and if it no longer matches the polarization of the source or drain, the non-local resistance will be much higher. This provides the basis for the non-local spin-valve, or coherent spin-FET.

In a "conventional" graphene-based spin valve (FIG. 2), as demonstrated by Tombros, et al, [5], and by Cho, et al. or Han, et al [6, 7] graphene injection from a polarized electrode occurs through a tunneling barrier, such as alumina or magnesia [8]. The electrons are polarized by an external applied magnetic field as they travel through the graphene. The spin density is thus characterized by classical diffusion kinetics, based on the long spin diffusion length of graphene [5], and limited by the grain boundary density of graphene, and also (in the case of $SiO_2$) by silica/graphene phonon interactions that limit the electron mobility [5, 9]. For these reasons—substrate phonon interference and grain-boundary densities, the performance (i.e., non-local resistance) of conventional graphene-based spin valves at room temperature has been disappointingly poor for practical device applications. [5-7].

In contrast, the inventive coherent spin-FET's properties derive from the fact that magnetic exchange interactions between oxide conduction electrons and oxide cations will result in the formation of magnetic polarons (FIG. 3a), as shown, which are stabilized relative to the ground state by ion/conduction electron exchange interactions (FIG. 3b). Since in this case the conduction band wavefunction itself is polarized, rather than individual electrons, we term such spin transport as coherent. Thus, magnetic polaron transport in graphene should be relatively independent of graphene grain boundary density. Further, such exchange interactions persist to and above room temperature, as there are relatively few avenues for spin relaxation and other phonon-mediated decay pathways. Further, if the ferromagnetic gate retains polarization at or above room temperature, no applied external magnetic field will be required to maintain polarization of graphene electrons, as the device should operate at remanance.

BRIEF DESCRIPTION OF THE DRAWINGS

The accompanying drawings, which are incorporated herein and constitute part of this specification, illustrate exemplary embodiments of the invention, and, together with the general description given above and the detailed description given below, serve to explain the features of the invention.

DETAILED DESCRIPTION OF THE INVENTION

Figure 1:
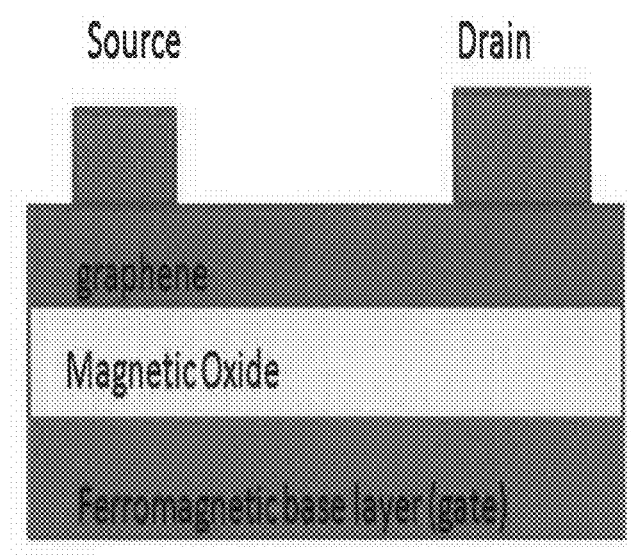
FIG. 1 is schematic of a proposed non-local Spin Field Effect Transistor (spin-FET), based on direct graphene growth on a magnetically polarizable oxide.
Figure 2:
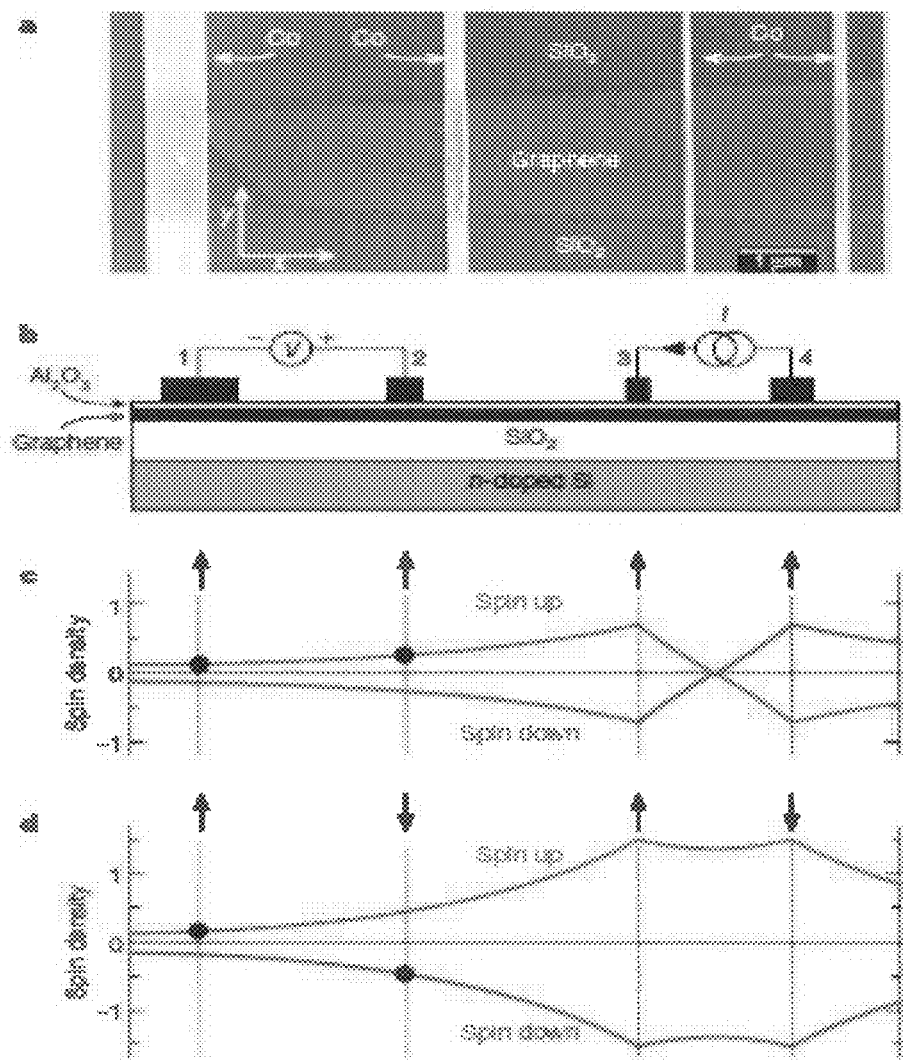
FIG. 2 is a graphene-based non-local spin valve based on diffusion of individual spin-polarized electrons through the graphene layer. (From Tombros, et al.)
Figure 3:
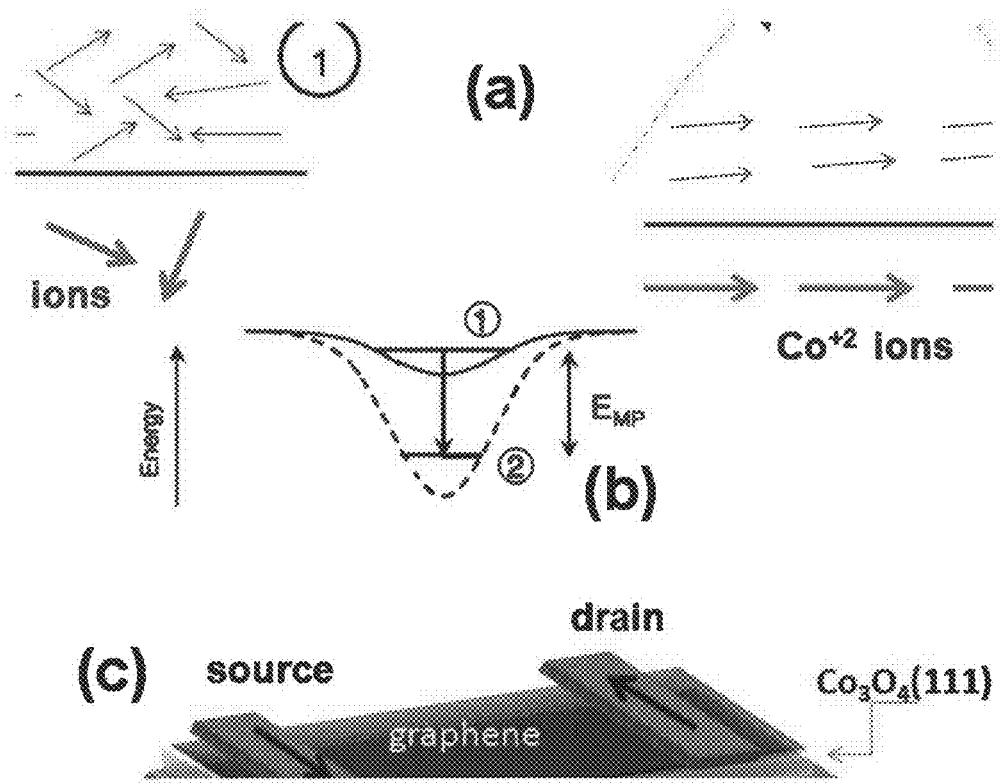
FIG. 3 is schematic illustration of magnetic polaron formation: (a) Alignment of graphene conduction band electrons with $Co^{+2}$ ions yields polarization of the conduction electrons by; (b) formation of a magnetic polaron, stabilized by the exchange interactions; and (c) spin-field effect transistor (spin-FET) geometry for testing this effect, which offers a low current, high on/off ratio non-local resistance even at 300 K.

Referring initially to the schematic illustration in FIG. 1, and recognizing that this is a "conventional representation" and that structure and dimensions will be subject to modification depending on the ultimate application envisioned, the formation of each layer of the coherent spin-FET of the invention is described. This is best begun with a discussion of the field itself, as shown.

Graphene—this film must consist of (111)-oriented, $sp^2$ carbon (graphene), as either a single layer or several layers, as desired to control potential oxide/graphene interactions such as charge transfer [10, 11]. This layer can be deposited by molecular beam epitaxy, or possibly by chemical or physical vapor deposition.

The deposition of graphene on a substrate has been described at some length in U.S. patent application Ser. No. 12/543,053, now U.S. Pat. No. 8,158,200 and U.S. patent application Ser. No. 12/980,763, now U.S. Pat. No. 8,685, 802, both of which are included herein-by-reference. Additional advances in the control over few layer graphene deposition are provided in U.S. Provisional Patent Application Ser. Nos. 61/490,650, now PCT/US12/39487 and 61/497,071, now PCT/US12/42140, both of which are incorporated herein-by-reference. The controlled direct growth of graphene by MBE (layer-by-layer growth of macroscopically continuous graphene sheets on $Co_3O_4(111)$ at 1000 K by carbon molecular beam epitaxy (MBE) from a graphite rod source) is described in detail in U.S. Provisional Patent Application Ser. No. 61/521,600, now U.S. Patent Publication No. US 2014/0212671. The disclosure of this pending application is incorporated herein-by-reference. Any of the methods described in the incorporated applications can be used to form the graphene field, with a preference for controlled molecular beam epitaxy.

Magnetic Oxide, Source and Drain: This material electrically isolates the graphene from the ferromagnetic gate layer, and allows polarization of the graphene valence/conduction electrons via polarization of the cations in the magnetic oxide. Potential candidates include $Co_3O_4(111)$, $Fe_3O_4(111)$, $NiO(111)$, and potentially spinels such as $CoFe_2O_4(111)$, as well as $Cr_2O_3(111)$, $BaFe_2O_4$. A critical feature is the polarization within the ion layer adjacent to the graphene (FIG. 1). The polarization of the ions must be ferromagnetic within each layer, even if adjacent ion layers in the oxide are polarized antiferromagnetically to each other. A uniform ferromagnetic polarization within the surface layer is needed to polarize the graphene electrons. Further, the direction of polarization is important. If the oxide ions are polarized in a direction parallel to the surface plane, then the graphene will be similarly polarized, and so must the source and drain. In that case, appropriate source/drain materials could be Co, Ni, Fe, or various alloys. However, if the oxide cations are polarized perpendicularly to the surface plane, then the source and drain should have easy axes of magnetization perpendicular to the plane, and should be made of materials such as Permalloy, Co—Pd alloys and multilayers, Co—Pt alloys and multilayers, Fe—Pt alloys and multilayers, some Llo ferromagnetic compounds, etc. Similar nickel-iron alloys, and triblends, such as Molybdenum permalloy, may also be used.

Note, since NiO(111) has the same rocksalt structure as MgO(111), deposition of graphene may result in oxide reconstruction, destroying the chemical equivalence of graphene A sites and B sites [12], removing the HOMO/LUMO equivalence at the Dirac point and opening a band gap, as set forth in U.S. Pat. No. 8,685,802. Development of bandgap potential in graphene bearing materials may provide important electronic advantages, in addition to preserving spintronic adaptability.

Ferromagnetic Gate: This layer should have its axis of magnetic polarization that is easily switchable and ideally has a low coercive field for multifunction logic gates, and be ferromagnetic at room temperature. Appropriate materials include Co, Ni, or Fe.

EXAMPLES

In order to prepare a coherent spin-FET of the invention, a sapphire (aluminum oxide (0001)) substrate is prepared for deposition. An electron beam evaporator may be used to reduce movement between chambers and improve productivity, switching in various targets for deposition. Thus, a fifty angstrom layer of cobalt may be deposited under conventional conditions on the substrate at 750° K in UHV. This deposition is followed by an oxidation anneal at 1000° K which results in surface segregation of dissolved oxygen and the development of a thin layer of $Co_3O_4$ (111) (may be 2-5 ML thick). Graphene (2 or 3 ML) is deposited on the $Co_3O_4$ using molecular beam epitaxy at 1000° K, yielding a macroscopically continuous graphene film of approximately 3 ML thickness. Graphene may also be deposited via CVD and PVD processes, as disclosed, but MBE is preferred, not only because of the fine control and developed information for this method, but because it is compatible with the other process steps in the formation of the coherent spin-FET of the invention. This leads to high productivity.

In this example, the coherent spin-FET is finished with the application of Co source and drain, and connected in the device for use. On magnetization, it is stable and exhibits a very high on/off rate with low power consumption at temperatures substantially above room temperature. Thus, referring to FIG. 1, the coherent spin-FET prepared has a gate of cobalt, with an insulating layer of cobalt oxide ($Co_3O_4$). A few ML layer of graphene is deposited over the magnetic oxide, with Co source and drain. Application of a field to the device gives a durable, low power, high on/off rate spin-FET that is operable at room temperature. The resulting coherent spin-FET gives on/off rates (or switching rates) of at least $10^7$-$10^8$ per second depending on the materials and conditions selected.

Figure 4:
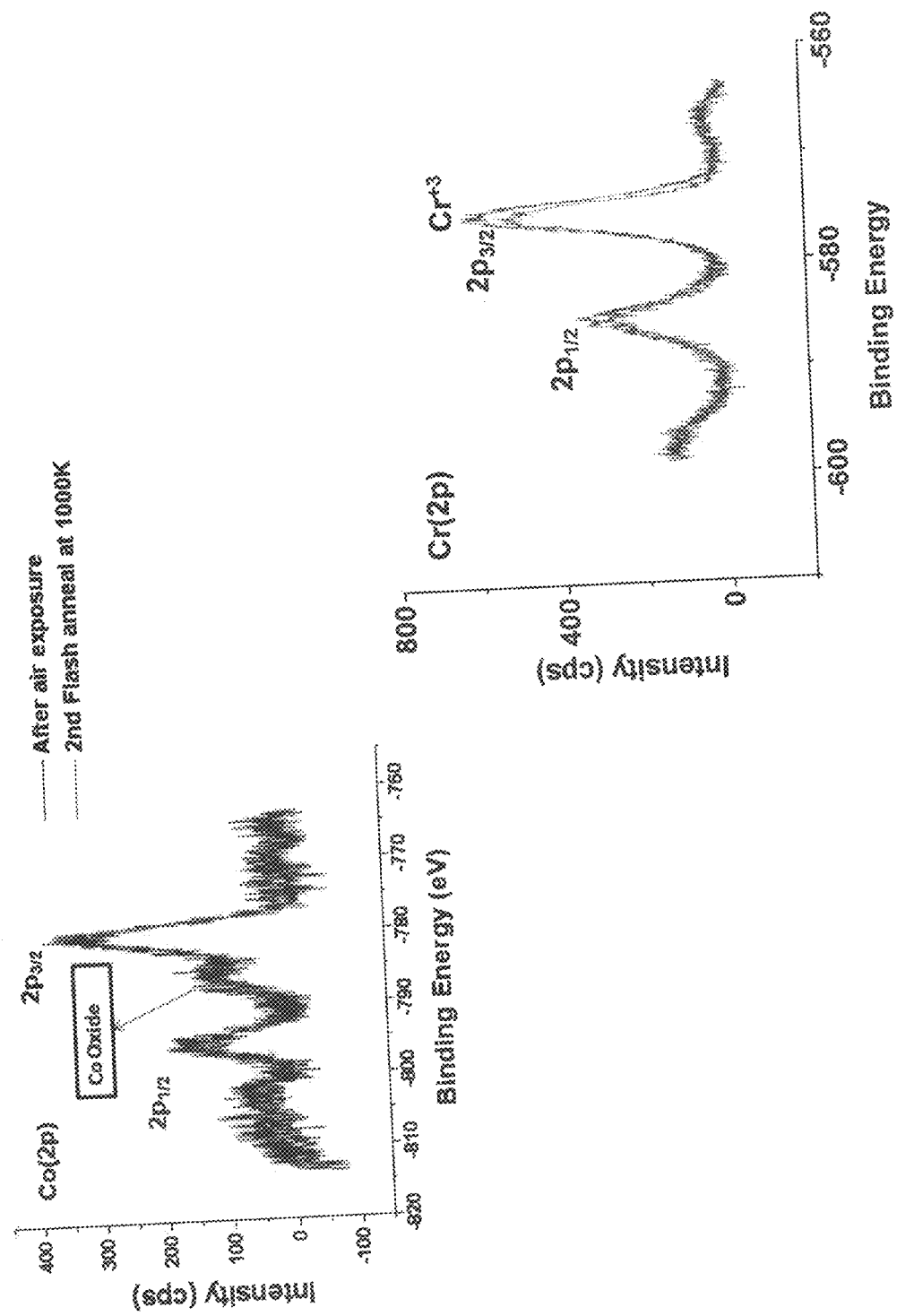
FIG. 4 is graph reflecting XPS data obtained for a bi-layer of chrome oxide on cobalt (0001). The XPS data in green reflects data obtained after insertion into UHV and annealing, while the data in red was acquired after subsequent exposure. No changes in XPS data were observed.

It would be advantageous to be able to provide a chrome oxide layer on which to deposit the graphene. This provides a means by which the coherent spin-FET may be made voltage switchable. To parallel the above example, we need to be able to deposit chrome on cobalt, and then oxidize it (in several stages, a Cr film of substantial thickness will not oxidize all at once). Cr was deposited by MBE (molecular beam epitaxy) onto a Co (0001) film in UHV (ultra-high vacuum) at room temperature, followed by oxidation with $O_2$ in three stages. The stack was then annealed to 1000° K in UHV. Good Auger and LEED data were obtained. Transfer to the XPS system yielded the Cr(2p) and Co(2p) XPS data set forth in in FIG. 4. The XPS data acquired after insertion in UHV and annealing (green) and the data obtained following subsequent exposure (red) showed no change.

Figure 5:
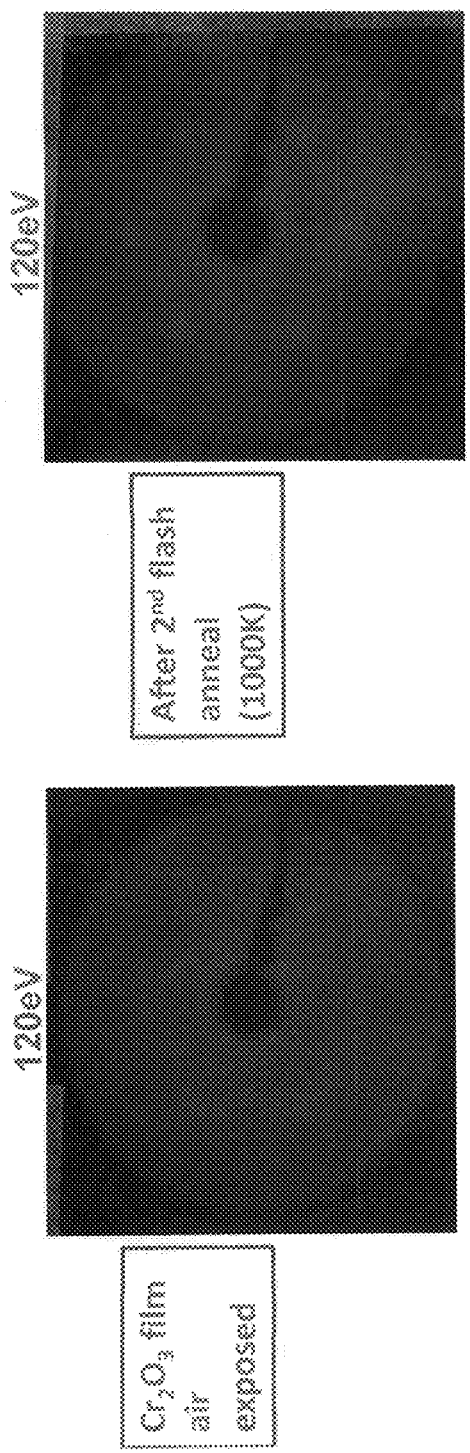
FIG. 5 reflects LEED data for a layer of chrome oxide on cobalt obtained in UHV (left) and following ambient exposure (right). No changes in LEED data were observed.

LEED data for the chromia film on cobalt is set forth in FIG. 5. The data on the left were acquired in UHV and the data on the right were acquired after ambient exposure. No changes were observed. There is a small amount of cobalt oxide at the interface. Analysis suggests a chromia film thickness of about 12 angstroms and a cobalt oxide film interface of about 3-3.5 angstroms. The absence of any further change in the cobalt oxide thickness or LEED data indicates that the chromia film is continuous and passivates the Co substrate against ambient conditions.

The voltage switchable coherent spin-FET with a cobalt base or gate and a chromium oxide layer there over is finished with a graphene layer and source and drain of cobalt, much as the cobalt/cobalt oxide spin-FET described above.

REFERENCES

[1] H. Haugen, D. Huertas-Hernando, A. Brataas. Spin transport in proximity-induced ferromagentic graphene. Physcal Review B. 77 (2008) 115406.
[2] R. Ozwaldowski, I. Zutic, A. G. Petukhov. Magnetism in closed-shell quantum dots: Emergence of magnetic bipolarons. Phys Rev Lett. 106 (2011) 177201.
[3] d. R. Yakovlev, W. Ossau, G. Landwehr, R. N. Bicknell-Tassius, A. Waag, S. Schmeusser. Two dimensional exciton magnetic polaron in $CdTe/Cd_{1-x}Mn_xTe$. Sol St Commun. 82 (1992) 29-32.
[4] D. R. Yakovlev, W. Ossau, G. Landwehr, R. N. Bicknell-Tassius, A. Waag, S. Schmeusser. Two dimensional exciton magnetic polaron in $CdTe/Cd_{1-x}Mn_xTe$ quantum well structures. Sol St Commun. 82 (1992) 29-32.
[5] N. Tombros, C. Jozsa, M. Popinciuc, H. T. Jonkman, B. J.v. Wees. Electronic spin transport and spin precession in single graphene layers at room temperature. Nature. (2007) 571-574.
[6] S. Cho, Y. Chen, M. S. Fuhrer. Gate-tuneable graphene spin valve. Applied Physics Letters. 91 (2007) 123105.
[7] W. Han, K. Pi, H. Wang, M. McCreary, Y. Li, W. Bao, P. Wei, J. Shi, C. N. Laun, R. K. Kawakami. Spin transport in graphite and graphene spin valves. Proceedings of SPIE. 7398 (2009) 739819-1.
[8] B. Dlubak, P. Seneor, A. Anane, C. Barraud, C. Deranlot, D. Deneuve, B. Servet, R. Mattana, F. Petroff, A. Fert. Are $Al_2O_3$ and MgO tunnel barriers suitable for spin injection in graphene? Appl Phys Lett. 97 (2010) 092502.
[9] V. E. Dorgan, M. Bae, E. Pop. Mobilty and saturation velocity in graphene on $SiO_2$. Appl Phys Lett. 97 (2010) 082112.
[10] J. A. Kelber, S. Gaddam, C. Vamala, S. Eswaran and P. A. Dowben. Proc. SPIE 8100 (2011) 8100 DY 1-13.
[11] M. Zhou, F. L. Pasquale, P. A. Dowben, A. Boosalis, M. Schubert, V. Darakchieva, R. Yakimova, J. A. Kelber. Direct graphene growth on Co3O4(111) by molecular beam epitaxy. J Phys: Cond Matt. (2011) in press.
[12] S. Gaddam, C. Bjelkevig, S. Ge, K. Fukutani, P. A. Dowben, J. A. Kelber. Direct graphene growth on MgO: Origin of the band gap. J Phys Cond Matt. 23 (2011) 072204.

While the present invention has been disclosed both generically and with reference to specific embodiments and examples, these alternatives are not intended to be limiting unless reflected in the claims set forth below. The invention is limited only by the provisions of the claims, and their equivalents, as would be recognized by one of skill in the art to which this application is directed.

What is claimed is:

1. A coherent spin field effect transistor (coherent spin-FET) comprising a ferromagnetic base layer or gate, a chrome oxide layer overlaying said base layer, a layer of graphene deposited over said chrome oxide layer, a separated source and drain both in electrical contact with said graphene layer, wherein polarization of ions in layers within said chrome oxide layer overlaying said base layer and adjacent said graphene layer is ferromagnetic within the layers wherein the ferromagnetic gate has an axis of magnetic polarization that is easily switchable and has a low coercive field and is ferromagnetic at 24° C.

2. The coherent spin-FET of claim 1, wherein said coherent spin-FET is voltage switchable.

3. A coherent spin field effect transistor (coherent spin-FET) comprising a ferromagnetic base layer or gate, a chrome oxide layer overlaying said base layer, a layer of graphene deposited over said chrome oxide layer, a separated source and drain both in electrical contact with said graphene layer, wherein polarization of ions in layers within said chrome oxide layer overlaying said base layer and adjacent said graphene layer is ferromagnetic within the layers wherein said gate is comprised of cobalt deposited on a substrate, and said graphene is no more than 3 ML thick, wherein said source and drain are comprised of cobalt.

* * * * *